United States Patent
Tsai

(10) Patent No.: US 10,818,341 B1
(45) Date of Patent: Oct. 27, 2020

(54) SUB-WORD LINE DRIVER CIRCUIT WITH VARIABLE-THICKNESS GATE DIELECTRIC LAYER, SEMICONDUCTOR MEMORY DEVICE HAVING THE SAME AND METHOD OF FORMING THE SAME

(71) Applicant: NANYA TECHNOLOGY CORPORATION, New Taipei (TW)

(72) Inventor: Jhen-Yu Tsai, Kaohsiung (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/435,167

(22) Filed: Jun. 7, 2019

(51) Int. Cl.
  *G11C 11/408* (2006.01)
  *G11C 8/08* (2006.01)
  *G11C 8/14* (2006.01)

(52) U.S. Cl.
  CPC ............ *G11C 11/4085* (2013.01); *G11C 8/08* (2013.01); *G11C 8/14* (2013.01)

(58) Field of Classification Search
  CPC .......... G11C 11/4085; G11C 8/14; G11C 8/08
  See application file for complete search history.

(56) References Cited

U.S. PATENT DOCUMENTS

| | | | |
|---|---|---|---|
| 7,432,143 B2 * | 10/2008 | Cho | H01L 27/0207 438/176 |
| 7,745,899 B2 * | 6/2010 | Oh | G03F 1/70 257/435 |
| 8,279,703 B2 * | 10/2012 | Yang | G11C 8/08 257/288 |
| 8,780,664 B2 | 7/2014 | Choi | |
| 9,583,152 B1 | 2/2017 | Jeong | |
| 2009/0180341 A1 | 7/2009 | Ide et al. | |
| 2011/0266597 A1 * | 11/2011 | Kim | H01L 29/0607 257/288 |

FOREIGN PATENT DOCUMENTS

| | | |
|---|---|---|
| TW | 200723306 | 6/2007 |
| TW | 201023343 A1 | 6/2010 |
| TW | I652729 B | 3/2019 |

OTHER PUBLICATIONS

Office Action dated Apr. 23, 2020 related to Taiwanese Application No. 108127045.

* cited by examiner

*Primary Examiner* — Gene N Audong
(74) *Attorney, Agent, or Firm* — Muncy, Geissler, Olds & Lowe, P.C.

(57) ABSTRACT

A sub-word line driver circuit includes a substrate, a plurality of gate lines, at least one gate tab, and a variable-thickness gate dielectric. The substrate includes an isolation area and an active area. The gate lines are arranged in a first direction and extend in a second direction perpendicular to the first direction. The gate tab extends in the first direction to cover the isolation area, in which the gate lines and the gate tab form at least one gate region on the substrate. The variable-thickness gate dielectric includes a thick gate dielectric region disposed over a first portion of the active area, and a thin gate dielectric region disposed over a second portion of the active area.

20 Claims, 8 Drawing Sheets

SUB-WORD LINE DRIVER CIRCUIT WITH VARIABLE-THICKNESS GATE DIELECTRIC LAYER, SEMICONDUCTOR MEMORY DEVICE HAVING THE SAME AND METHOD OF FORMING THE SAME

TECHNICAL FIELD

The present disclosure relates to integrated circuit technology, and more particularly, to a sub-word line driver circuit, a semiconductor memory device, and a method of forming the same.

DISCUSSION OF THE BACKGROUND

The semiconductor industry continues to improve the integration density of various electronic components (e.g., transistors, diodes, resistors, capacitors, etc.) by making continual reductions in minimum feature size, which allow more components to be integrated in a given area.

Semiconductor memory devices are configured to store data in and read data from memory cells connected to word lines and bit lines. Memory cells connected to one word line are selected simultaneously based on a word line voltage that is applied to the one word line. With the increase of the storage capacity of a semiconductor memory device, more memory cells are connected to one word line and thus a current-driving capacity of a word line driver needs to be increased. When the current-driving capacity of the word line driver is limited, a delay in driving a selected word line connected to a relatively large number of memory cells becomes serious. To solve problems due to such delay, a word line may be divided into a plurality of sub-word lines, and the plurality of the sub-word lines may be driven by sub-word line drivers (SWD), respectively.

A sub-word line driver provides a sub-word line with a boost voltage having a higher level than a power supply voltage to select a relatively small number of memory cells connected to one sub-word line. The boost voltage is applied to a pull-up transistor such as a p-type metal oxide semiconductor (PMOS) included in the sub-word line driver. When the pull-up transistor operates repeatedly based on the boost voltage having a high voltage level, degradation such as a hot electron induced punch through (HEIP) may arise and a standby current may increase, and thus the reliability of the sub-word line driver is reduced. As such, a sub-word line driver circuit with reliable characteristics is required as device integration density increases.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a sub-word line driver circuit that includes a substrate, a plurality of gate lines formed on the substrate, at least one gate tab formed on the substrate, and a variable-thickness gate dielectric. The substrate includes an isolation area and an active area. The gate lines are arranged sequentially in a first direction and extend in a second direction perpendicular to the first direction. The gate tab extends in the first direction to cover the isolation area, in which the gate lines and the gate tab form at least one gate region on the substrate. The variable-thickness gate dielectric is disposed between the gate region and the active area. The variable-thickness gate dielectric includes a thick gate dielectric region disposed over a first portion of the active area, and a thin gate dielectric region disposed over a second portion of the active area.

In some embodiments, a length of the thick gate dielectric region is determined according to the at least one gate tab.

In some embodiments, a thickness of the thick gate dielectric region is determined according to the at least one gate tab.

In some embodiments, the thick gate dielectric region comprises an intermediate gate dielectric region and the thin gate dielectric region.

In some embodiments, the thickness of the thick gate dielectric region is substantially equal to a combined thickness of the intermediate gate dielectric region and the thin gate dielectric region.

In some embodiments, the at least one gate tab is enlarged in the second direction to further cover a boundary portion of the active area, the boundary portion being adjacent to the isolation area.

In some embodiments, the gate lines include a first gate line and a second gate line arranged sequentially in the first direction, in which the at least one gate tab is formed to cover the isolation area between the first gate line and the second gate line.

In some embodiments, the at least one gate tab is enlarged in the second direction to further cover a boundary portion of the active area between the first gate line and the second gate line, the boundary portion being adjacent to the isolation area.

In some embodiments, a drain region and a source region are formed in the active area, wherein a sub-word line drive signal is applied to the source region, a word line enable signal is applied to the gate line, and the drain region is connected to a sub-word line.

Another aspect of the present disclosure provides a semiconductor memory device, including a sub-word line driver circuit and a memory cell array. The sub-word line driver circuit is configured to provide a sub-word line with a sub-word line drive signal in response to a word line enable signal. The memory cell array includes a plurality of memory cells, and each of the memory cells connects to the sub-word line and a bit line. The sub-word line driver circuit includes a substrate, a plurality of gate lines formed on the substrate, at least one gate tab formed on the substrate, and a variable-thickness gate dielectric. The substrate includes an isolation area and an active area. The gate lines are arranged sequentially in a first direction and extend in a second direction perpendicular to the first direction. The gate tab extends in the first direction to cover the isolation area, in which the gate lines and the gate tab form at least one gate region on the substrate. The variable-thickness gate dielectric is disposed between the gate region and the active area. The variable-thickness gate dielectric includes a thick gate dielectric region disposed over a first portion of the active area, and a thin gate dielectric region disposed over a second portion of the active area.

In some embodiments, a length of the thick gate dielectric region is determined according to the at least one gate tab.

In some embodiments, a thickness of the thick gate dielectric region is determined according to the at least one gate tab.

In some embodiments, the thick gate dielectric region comprises an intermediate gate dielectric region and the thin gate dielectric region.

In some embodiments, the thickness of the thick gate dielectric region is substantially equal to a combined thickness of the intermediate gate dielectric region and the thin gate dielectric region.

In some embodiments, the at least one gate tab is enlarged in the second direction to further cover a boundary portion of the active area, the boundary portion being adjacent to the isolation area.

In some embodiments, the gate lines include a first gate line and a second gate line arranged sequentially in the first direction, in which the at least one gate tab is formed to cover the isolation area between the first gate line and the second gate line.

In some embodiments, the at least one gate tab is enlarged in the second direction to further cover a boundary portion of the active area between the first gate line and the second gate line, the boundary portion being adjacent to the isolation area.

In some embodiments, a drain region and a source region are formed in the active area, wherein a sub-word line drive signal is applied to the source region, a word line enable signal is applied to the gate line, and the drain region is connected to a sub-word line.

Another aspect of the present disclosure provides a method of forming a sub-word line driver circuit, including forming an intermediate gate dielectric in a channel region; removing the intermediate gate dielectric from a thin gate dielectric region of the channel region; and forming a thin gate dielectric over the intermediate gate dielectric and the thin gate dielectric region, in which a thick gate dielectric region includes the thin gate dielectric and the intermediate gate dielectric.

In some embodiments, a length of the thick gate dielectric region is determined according to at least one gate tab, and a thickness of the thick gate dielectric region is determined according to the at least one gate tab.

Due to the function of the variable-thickness gate dielectric, the effects from a strong electric field caused by the enlarged gate tab may be mitigated by the thick gate dielectric thickness of the thick gate dielectric region, and the corresponding transistor may have optimal performance in applications such as a high-voltage transistor of a sub-word line driver circuit.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

The following description of the disclosure accompanies drawings, which are incorporated in and constitute a part of this specification, and illustrate embodiments of the disclosure, but the disclosure is not limited to the embodiments. In addition, the following embodiments can be properly integrated to complete another embodiment.

References to "one embodiment," "an embodiment," "exemplary embodiment," "other embodiments," "another embodiment," etc. indicate that the embodiment(s) of the disclosure so described may include a particular feature, structure, or characteristic, but not every embodiment necessarily includes the particular feature, structure, or characteristic. Further, repeated use of the phrase "in the embodiment" does not necessarily refer to the same embodiment, although it may.

The present disclosure is directed to a sub-word line driver circuit, a semiconductor memory device, and a method of formation. In order to make the present disclosure completely comprehensible, detailed steps and structures are provided in the following description. Obviously, implementation of the present disclosure does not limit special details known by persons skilled in the art. In addition, known structures and steps are not described in detail, so as not to unnecessarily limit the present disclosure. Preferred embodiments of the present disclosure are described in detail below. However, in addition to the detailed description, the present disclosure may also be widely implemented in other embodiments. The scope of the present disclosure is not limited to the detailed description, but is defined by the claims.

Figure 1:
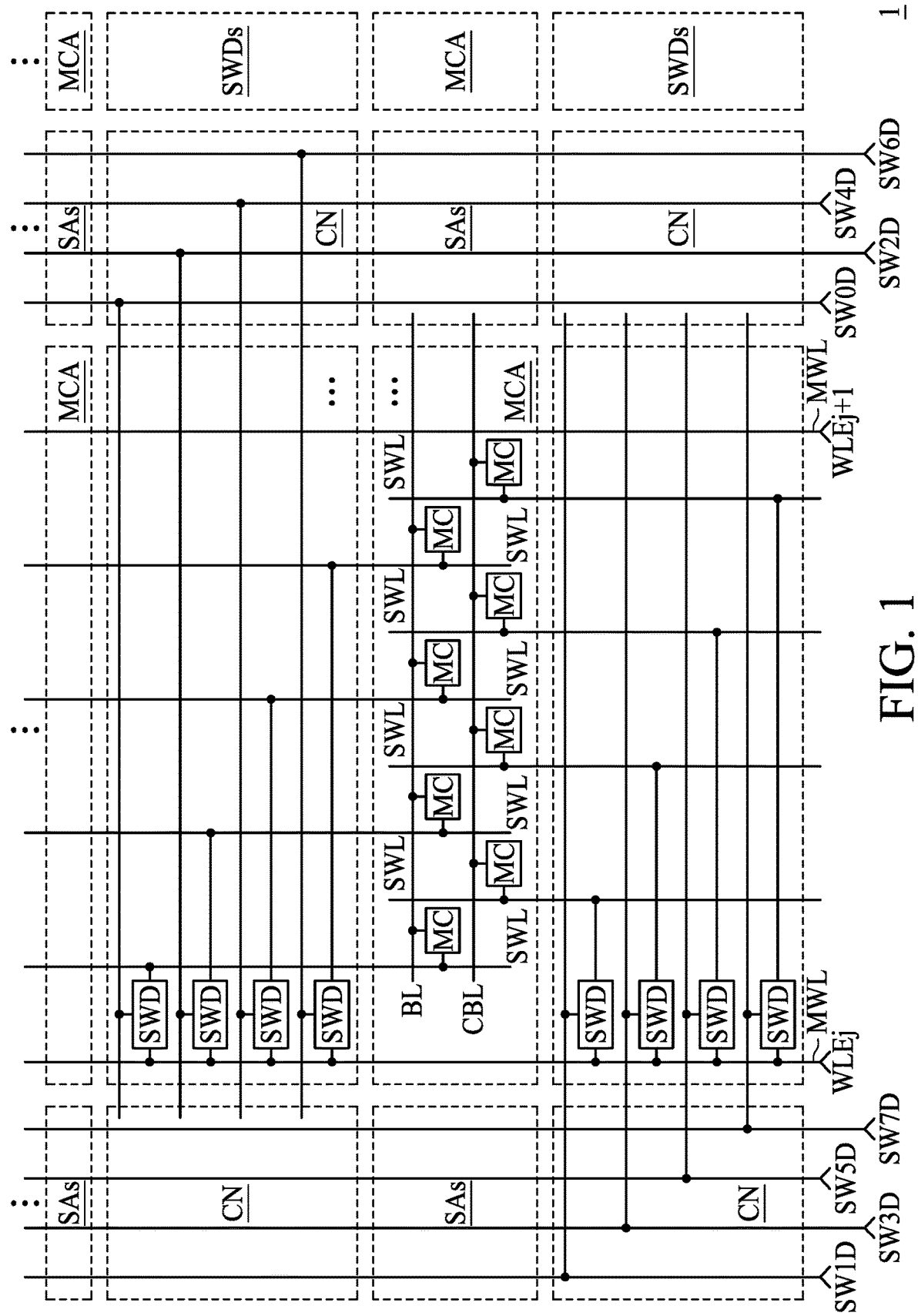
FIG. 1 is a diagram depicting a semiconductor memory device in accordance with some embodiments of the present disclosure.

In accordance with some embodiments of the disclosure, FIG. 1 is a diagram depicting a semiconductor memory device. With reference to FIG. 1, a semiconductor memory device 1 includes a memory cell array MCA, a sub-word line driver block SWDs, a sense amplifier block SAs, and a connection block CN. The memory cell array MCA includes a plurality of memory cells MC connected to a corresponding sub-word line SWL and one of a bit line BL and a complementary bit line CBL. Since the memory cells MC are connected to sub-word line drivers SWD, respectively, the memory cells MC operate based on a word line enable signal WLEj and a sub-word line drive signal SWkD. The word line enable signal WLEj applied to a respective main word line MWL may be activated based on a first bit of a row address, for example. Moreover, in some embodiments, the sub-word line drive signal SWkD applied to the respective sub-word line SWL may be activated based on a second bit of the row address to read data from and write data to the memory cells MC connected to the sub-word line SWL that is selected based on the word line enable signal WLEj and the sub-word line drive signal SWkD. As shown in FIG. 1, the main word line MWL is divided into a plurality of sub-word lines SWL, and accordingly a delay due to insufficient current-driving capacity of a main word line driver may be decreased.

In some embodiments, the memory cell MC may have a different structure to reflect different types of semiconductor memory devices. For example, when the semiconductor memory device 1 is a dynamic random access memory (DRAM), each memory cell MC may include at least one transistor and a capacitor. The at least one transistor may be connected to a sub-word line SWL and a bit line BL. The capacitor may be charged or discharged by a voltage level of the bit line BL in response to a signal applied to the sub-word line SWL. The semiconductor memory device 1 may further include a refresh circuit that maintains a voltage level of the capacitor since charges stored in the capacitor may be self-discharged.

In some embodiments, a plurality of sub-word line drivers SWD may be formed in each sub-word line driver block SWDs. As shown in FIG. 1, for example, eight sub-word line drivers SWD are controlled by one word line enable signal WLEj. The number of sub-word line drivers SWD controlled by one word line enable signal WLEj may be changed in other embodiments. Each of the sub-word line drivers SWD receives the word line enable signal WLEj and the corresponding sub-word line drive signal SWkD, and provides the corresponding sub-word line SWL with the corresponding sub-word line drive signal SWkD based on the word line enable signal WLEj. The word line enable signal WLEj and the sub-word line drive signal SWkD, which are provided to the sub-word line driver SWD, may be activated based on a row address. The sub-word line driver SWD may provide the sub-word line SWL with the sub-word line drive signal SWkD in response to the word line enable signal WLEj. An activated sub-word line drive signal SWkD may have a voltage level of a boost voltage that is the highest of the internal voltages used in the semiconductor memory device 1. When the sub-word line driver SWD operates repeatedly based on a boost voltage of a relatively high level, a reliability of the sub-word line driver SWD may be decreased because of the degradation of the gate dielectric. To reduce such degradation, the sub-word line driver SWD of the semiconductor memory device 1 in some embodiments of the disclosure includes an extended gate tab and a variable-thickness gate dielectric, which are discussed later in the disclosure.

In some embodiments, the sense amplifier block SAs includes a plurality of sense amplifiers. The plurality of sense amplifiers may read and amplify data stored in memory cells MC, or may amplify data to be written to memory cells MC and provide bit lines BL with the amplified data. The sense amplifier area SAs may further include latches that temporarily store data read from memory cells MC or data to be written to memory cells MC. Moreover, the sense amplifier area SAs may further include equalizers that precharge and/or equalize a bit line pair BL and CBL. In the connection block CN, the sub-word line drive signal SWkD is electrically connected to a respective sub-word line driver SWD. The sub-word line drive signal SWkD may be activated based on a row address from an address decoder. For example, the sub-word line drive signal SWkD may be provided to a $k^{th}$ sub-word line driver SWD that is selected based on the row address.

In some embodiments, the semiconductor memory device 1 may further include a host interface unit, a control unit, an address decoder and a peripheral circuit. The host interface unit may communicate with external devices (e.g., a host device) using various interface protocols, such as universal serial bus (USB), multi-media card (MMC), integrated drive electronics (IDE), serial advanced technology attachment (SATA), PCI-E, parallel advanced technology attachment (PATA), small computer system interface (SCSI), enhanced small disk interface (ESDI) and the like, to receive a command or to output data. The host interface unit may convert the received data into data having an appropriate format for an internal circuit of the semiconductor memory device 1, and provide the control unit with the converted command. The control unit may generate an operation mode signal and an address signal used in reading or writing data.

In some embodiments, the address decoder may include a row decoder and a column decoder that receive the address signal from the control unit. The row decoder may generate the word line enable signal WLEj and the sub-word line drive signal SWkD, and may provide the sub-word line driver SWD with the word line enable signal WLEj and the sub-word line drive signal SWkD. In such hierarchical configuration of a word line as illustrated in FIG. 1, a plurality of the sub-word line drivers SWD coupled to the same main word line MWL are selected in response to the word line enable signal WLEj, and then one sub-word line is selected from a plurality of sub-word lines SWL in response to the sub-word line drive signals SWkD, where k=, 1, 2, . . . , 7 in the example shown in FIG. 1. In some embodiments, the row decoder may further generate a sub-word line disable signal SWkB (shown in FIG. 2), which is complementary to the sub-word line drive signal SWkD, based on the row address. Accordingly, the row decoder may provide the sub-word line driver SWD with the sub-word line drive signal SWkD and the sub-word line disable signal SWkB.

Figure 2:
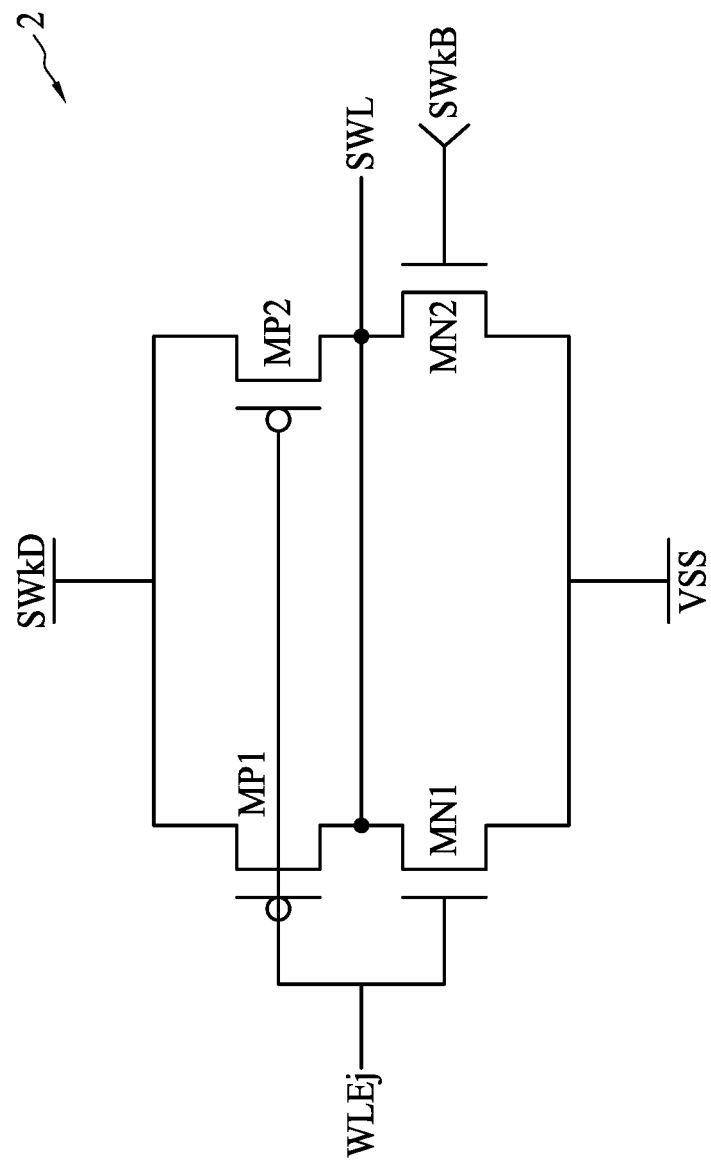
FIG. 2 is a circuit diagram depicting a sub-word line driver circuit in accordance with some embodiments of the present disclosure.

FIG. 2 is a circuit diagram depicting a sub-word line driver circuit in accordance with some embodiments of the present disclosure. With reference to FIG. 2, a sub-word line driver circuit 2 of FIG. 2 is connected to a $j^{th}$ main word line MWL and a k sub-word line SWL among sub-word lines controlled by the $j^{th}$ main word line MWL shown in FIG. 1. The sub-word line driver circuit 2, which may represent the sub-word line driver SWD of FIG. 1, may include a first p-type metal oxide semiconductor (PMOS) transistor MP1, a second PMOS transistor MP2, a first n-type metal oxide semiconductor (NMOS) transistor MN1, and a second NMOS transistor MN2. Each of the first PMOS transistor MP1 and the second PMOS transistor MP2 includes a source receiving the sub-word line drive signal SWkD, a gate receiving the word line enable signal WLEj, and a drain connected to a sub-word line SWL. The gates of the first PMOS transistor MP1 and the second PMOS transistor MP2 are connected to a main word line MWL. The word line enable signal WLEj may be applied to the gates of the first PMOS transistor MP1 and the second PMOS transistor MP2 simultaneously.

In some embodiments, the first NMOS transistor MN1 includes a source connected to a ground voltage VSS, a gate receiving the word line enable signal WLEj, and a drain connected to the sub-word line SWL. The second NMOS transistor MN2 includes a source connected to the ground voltage VSS, a gate receiving the sub-word line disable signal SWkB, and a drain connected to the sub-word line SWL.

In some embodiments, the word line enable signal WLEj may be activated at a logic low level, the sub-word line drive signal SWkD may be activated at a logic high level, and the sub-word line disable signal SWkB may be activated at the logic high level. The first PMOS transistor MP1 and the second PMOS transistor MP2 may be turned on in response to the word line enable signal WLEj, and may provide the sub-word line SWL with the sub-word line drive signal SWkD. When the sub-word line drive signal SWkD is activated based on the row address, the activated sub-word line drive signal SWkD may have a voltage level of the boost voltage. The boost voltage may be generated by pumping a supply voltage, and may be at a higher level than the supply voltage.

In some embodiments, the sub-word line disable signal SWkB may be used for decreasing a voltage level of the sub-word line SWL. For example, when the word line enable signal WLEj is deactivated such that the word line enable signal WLEj is at a voltage level higher than a threshold voltage of the first NMOS transistor MN1, the first PMOS transistor MP1 and the second PMOS transistor MP2 are turned off, and the first NMOS transistor MN1 is turned on. Therefore, the voltage level of the sub-word line SWL may be decreased to the ground voltage VSS regardless of the sub-word line disable signal SWkB. However, when the word line enable signal WLEj is activated and the sub-word line drive signal SWkD is deactivated such that the word line enable signal WLEj and the sub-word line drive signal SWkD are at a voltage level of the ground voltage VSS, the first NMOS transistor MN1 is turned off, and the first PMOS transistor MP1 and the second PMOS transistor MP2 are turned on. Therefore, the first PMOS transistor MP1 and the second PMOS transistor MP2 should transfer the sub-word line drive signal SWkD to the sub-word line SWL to decrease the voltage level of the sub-word line SWL to the voltage level of the ground voltage VSS. However, without using the sub-word line disable signal SWkB, the voltage level of the sub-word line SWL may be maintained at a level of a threshold voltage of the first PMOS transistor MP1 and the second PMOS transistor MP2 because of a coupling effect between the sub-word lines SWL. When the sub-word line disable signal SWkB, which is activated when the sub-word line drive signal SWkD is deactivated, is applied to the gate of the second NMOS transistor MN2, the second NMOS transistor MN2 is turned on, and the voltage level of the sub-word line SWL may be decreased to the level of the ground voltage VSS in spite of the coupling between sub-word lines SWL.

In some embodiments, the first PMOS transistor MP1 and the second PMOS transistor MP2 may operate as pull-up transistors, and the first NMOS transistor MN1 and the second NMOS transistor MN2 may operate as pull-down transistors. When a particular sub-word line SWL is selected repeatedly, the boost voltage of a high level may be repeatedly applied to source regions of the first PMOS transistor MP1 and the second PMOS transistor MP2. In this case, the source regions of the first PMOS transistor MP1 and the second PMOS transistor MP2 may be degraded. Hot carriers may be generated because of an abrupt increase of electrons passing through a channel that is formed at the active area under a gate region, and a short channel effect may be caused. In accordance with some embodiments, in order to mitigate the degradation and increase the reliability of the sub-word line driver SWD, a gate tab may be enlarged in a direction along which the isolation area is formed so that the gate tab may cover an isolation area between the gate regions of the first PMOS transistor MP1 and the second PMOS transistor MP2. Moreover, a variable-thickness gate dielectric further enhances the reliability of the sub-word line driver SWD. It should be noted that the first PMOS transistor MP1 and the second PMOS transistor MP2 included in one sub-word line driver SWD may be a PMOS transistor pair. The gate tabs may be formed to be spaced apart from each other so that the PMOS transistor pairs are separated from each other, for example.

Figure 3:
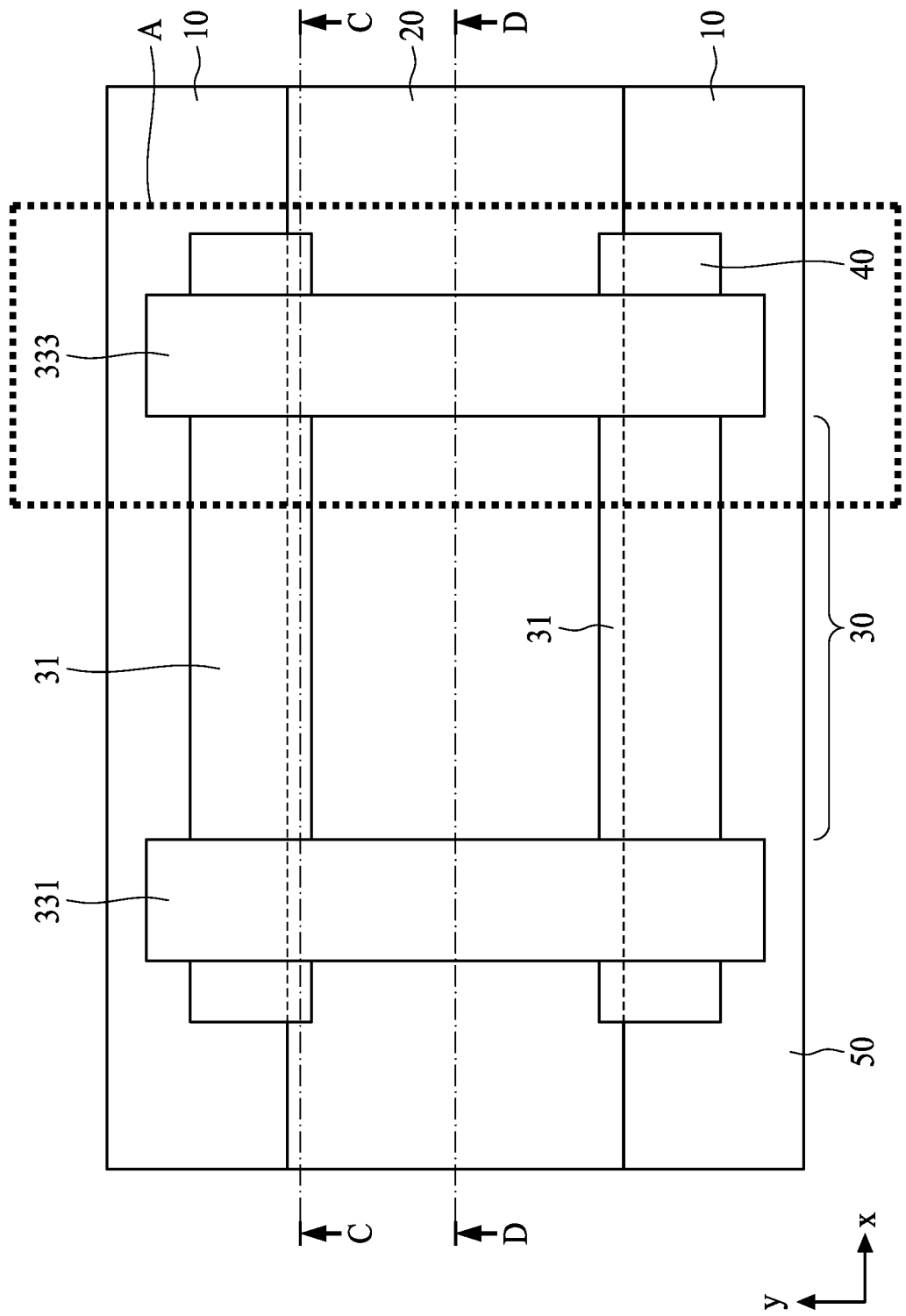
FIG. 3 is a diagram depicting a schematic layout of a sub-word line driver circuit in accordance with some embodiments of the present disclosure.

FIG. 3 is a diagram depicting a schematic layout of a sub-word line driver circuit in accordance with some embodiments of the present disclosure. With reference to FIG. 3, the sub-word line driver circuit may include the transistors of the sub-word line driver circuit 2 depicted in FIG. 2. The transistors may be formed in and on a substrate 50, which may be a semiconductor substrate. The substrate 50 includes an active area 20 and an isolation area 10 for partitioning and isolating the active area 20. A source and a drain of a transistor may be formed in the active area 20 of the substrate 50, and a gate of the transistor is formed in at least one gate region 30 of the substrate 50. Moreover, in some embodiments, at least one gate tab 40 is formed to cover the isolation area 10. For example, the transistors may be the first PMOS transistor MP1 and the second PMOS transistor MP2 depicted in FIG. 2, which operate as a pair of pull-up transistors. The isolation area 10 may be formed on the substrate 50 to be enlarged in a first direction by a shallow trench isolation (STI) process. The STI process may be used for isolating a plurality of transistors having a narrow channel width since the STI process satisfies a design rule of semiconductor memory devices having a high integration degree. An STI structure may be formed on the substrate 50 in the first direction, and the trench may be filled with an insulation material to form the isolation area 10.

In some embodiments, the substrate 50 may include the isolation area 10 enlarged in the first direction and the active area 20 separated from the isolation area 10. The substrate 50 may include a silicon substrate, a germanium substrate, a silicon-germanium substrate, a germanium-on-insulator (GOI) substrate, or a silicon-on-insulator (SOI) substrate, for example. The isolation area 10 may be formed by a local oxidation of silicon (LOCOS) process, or other suitable semiconductor processes. In the LOCOS process, a thermal oxidation layer is formed in an area of the substrate 50 which is not covered by a silicon nitride layer in order to form the isolation area 10.

In some embodiments, the active area 20 may be defined as an area of the substrate 50 partitioned and isolated by the isolation area 10. Therefore, the active area 20 may be formed to be enlarged in the first direction, which is the same direction along which the isolation area 10 is enlarged. A source region and a drain region may be formed in the active area 20. In a PMOS transistor, the active area 20 may correspond to an n-type substrate or an n-type well area formed in a p-type substrate, and the source region and the drain region may correspond to a p-type impurity region. The gate region 30 may be formed on the substrate 50 to be enlarged in a second direction perpendicular to the first direction, so that the gate region 30 may cross the isolation area 10 and the active area 20. The gate region 30 may be formed by the first gate line 331, a second gate line 333, and the gate tab 40. In some embodiments, the first gate line 331 may be included in the first PMOS transistor MP1 of FIG. 2, and the second gate line 333 may be included in the second PMOS transistor MP2 of FIG. 2. The same word line enable signal WLEi may be applied to the first gate line 331 and the second gate line 333 simultaneously. As depicted in FIG. 3, the first direction may be a direction of an x-axis, and the second direction may be a direction of a y-axis, for example.

In some embodiments, the first gate line 331 and the second gate line 333 may form a ring structure such that each end of the first gate line 331 and the second gate line 333 may be enlarged in the isolation area 10 in the first direction to connect to each other, thereby forming the ring structure.

In some embodiments, the gate region 30 may be fabricated by forming a gate insulation layer, a gate conduction layer, and a gate mask layer, then patterning the gate mask layer, the gate electrode, and the gate insulation layer. The gate electrode may be formed in a single layer that includes a doped polysilicon layer, a metal layer, or a conductive metal nitride layer. The gate electrode may also be formed in a multilayer structure including the doped polysilicon layer, the metal layer, or the conductive metal nitride layer. The gate mask layer may be formed using a material having an etch selectivity in consideration of the gate electrode and the gate insulation layer. In the active area 20, electrons and holes that pass through a channel, which is formed under the gate region 30, based on a voltage difference between a voltage applied to the source region in the active area 20 and a voltage applied to the drain region in the active area 20, may be generated as an electron hole pair (EHP) in a portion that is adjacent to a boundary between the gate region 30 and the isolation area 10. When a relatively high voltage such as the boost voltage is applied to the source region, many EHPs may be generated. Electrons included in the generated EHPs may flow along a boundary between the insulation area 10 and the active area 20 as a hot carrier to increase a standby current and to decrease a drive current, which indicates degradation of the transistors formed in the substrate 50.

Moreover, a short channel effect may be caused by the hot carriers. The short channel effect represents a phenomenon in which an effective channel length is reduced since an electron hole pair is coupled together around a boundary of the channel. A threshold voltage of the transistor may be changed because of the short channel effect, and as a result, the on/off operations of the transistor may not be performed correctly. Accordingly, the boost voltage may not be transferred to the sub-word line SWL correctly. The transistor's operation may also be further degraded because of a leakage current. To mitigate these effects, an effective length of the channel adjacent to the boundary between the gate region 30 and the isolation area 10 is increased, such that the gate tab 40 may be enlarged in the first direction according to some embodiments of the present disclosure.

In some embodiments, the gate tab 40 may be formed on the substrate 50, such that the gate tab 40 is enlarged in the first direction to cover the isolation area 10. The gate tab 40 may also be enlarged in the second direction to further cover a boundary portion 21 of the active area 20, where the boundary portion 21 is adjacent to the isolation area 10. For instance, the gate tab 40 may be formed on the substrate 50 with greater length in the first direction so that the gate tab 40 may cover the isolation area 10 between the first gate line 331 and the second gate line 333, and may cover the boundary portion 21 of the active area 20, where the boundary portion 21 is adjacent to the isolation area 10 between the first gate line 331 and the second gate line 333. One gate tab 40 may also be arranged in the second direction, such that each gate tab 40 covers the isolation area 10 between the first gate line 331 and the second gate line 333. In some embodiments, to mitigate the effects of a strong electric field resulting from the extension of the gate tab 40, a variable-thickness gate dielectric, as shown in FIG. 4, may be introduced.

Figure 4:
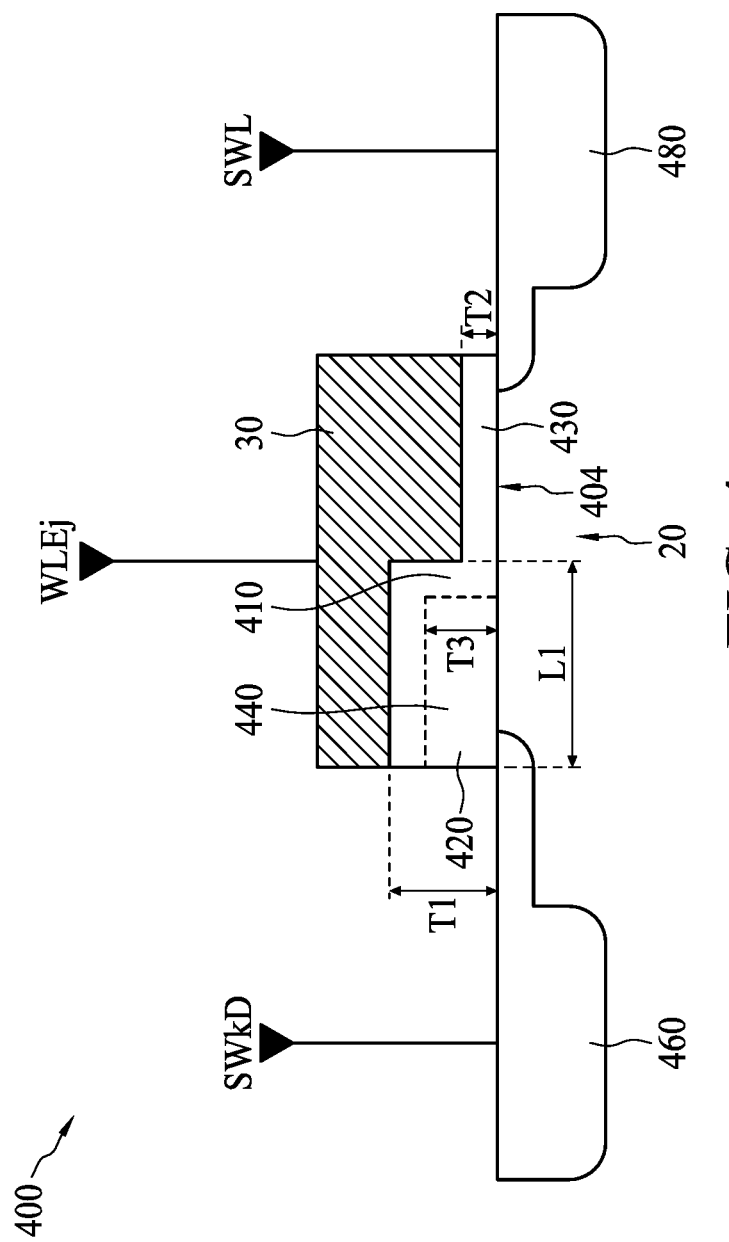
FIG. 4 is a cross-sectional view depicting a region A of FIG. 3 along a line C-C, in accordance with some embodiments of the present disclosure.

FIG. 4 is a cross-sectional view depicting a region A of FIG. 3 along a line C-C, in accordance with some embodiments of the present disclosure. With reference to FIG. 4, the cross-section of the region A along the line C-C depicts a transistor 400, which may represent a high-voltage transistor such as the first PMOS transistor MP1 or the second PMOS transistor MP2 of FIG. 2, for example. It should be noted that, in the region A of FIG. 3 along the line C-C, the gate tab 40 is enlarged in the first direction to compensate for the high-voltage transistor 400, and thus a thicker gate dielectric in this region may mitigate the effects of a strong electric field due to the enlarged gate tab 40. Accordingly, a variable-thickness gate dielectric 410 is disposed between the gate region 30 and the active area 20. As shown in FIG. 4, the variable-thickness gate dielectric 410 includes a thick gate dielectric region 420 over a first portion of the active area 20, and a thin gate dielectric region 430 over a second portion of the active area 20. In some embodiments, the variable-thickness gate dielectric 410 may be formed in a channel region 404 of the active area 20. A source region 460 and a drain region 480 are formed in the active area 20, and the channel region 404 is disposed between the source region 460 and the drain region 480. Moreover, the sub-word line drive signal SWkD is applied to the source region 460, the word line enable signal WLEj is applied to the gate region 30, and the drain region 480 is connected to a sub-word line. In some embodiments, the variable-thickness gate dielectric 410 may include silicon dioxide or other suitable gate dielectric materials.

In some embodiments, a length L1 of the thick gate dielectric region 420 is determined according to the gate tab 40, in which the determination may be made in accordance with the extension of the gate tab 40, for example. Moreover, a thickness T1 of the thick gate dielectric region 420 is determined according to the gate tab 40, in which the determination may be made in accordance with the extension of the gate tab 40, for example. In some embodiments, the thick gate dielectric region 420 includes an intermediate gate dielectric region 440 and the thin gate dielectric region 430. The thickness T1 of the thick gate dielectric region 420 may be substantially equal to a combined thickness of the intermediate gate dielectric region 440 and the thin gate dielectric region 430, or the combined thicknesses of T3 and T2. Due to the variable-thickness gate dielectric 410, the effects from a strong electric field due to the enlarged gate tab 40 may be mitigated by the thick gate dielectric thickness T1 of the thick gate dielectric region 420, and the transistor 400 may provide optimal performance in applications such as a high-voltage transistor of a sub-word line driver circuit.

Figure 5:
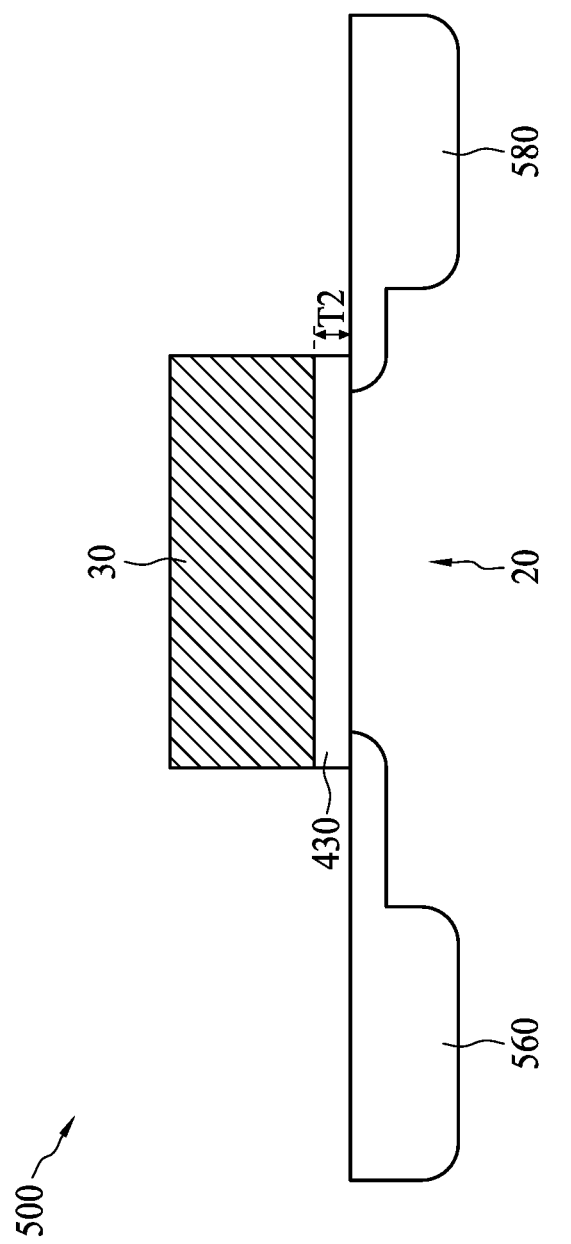
FIG. 5 is a cross-sectional view depicting the region A of FIG. 3 along a line D-D, in accordance with some embodiments of the present disclosure.

FIG. 5 is a cross-sectional view depicting the region A of FIG. 3 along a line D-D, in accordance with some embodiments of the present disclosure. With reference to FIG. 5, the cross-section of the region A along the line D-D depicts a transistor 500, which may represent a low-voltage transistor such as the first NMOS transistor MN1 or the second NMOS transistor MN2 of FIG. 2, for example. It should be noted that other low-voltage transistors may also be set in this area, such as a low-voltage transistor of a peripheral circuit of the semiconductor memory device 1 of FIG. 1, for instance. Due to the low voltage specifications, the thick gate dielectric region 420 of the variable-thickness gate dielectric 410 is not required for the transistor 500, and accordingly the thin gate dielectric region 430 is disposed between the gate region 30 and the active area 20. In the transistor 500, a source region 560 and a drain region 580 are formed in the active area 20, which may be connected in accordance with the applications of the low-voltage transistor 500.

Figure 6:
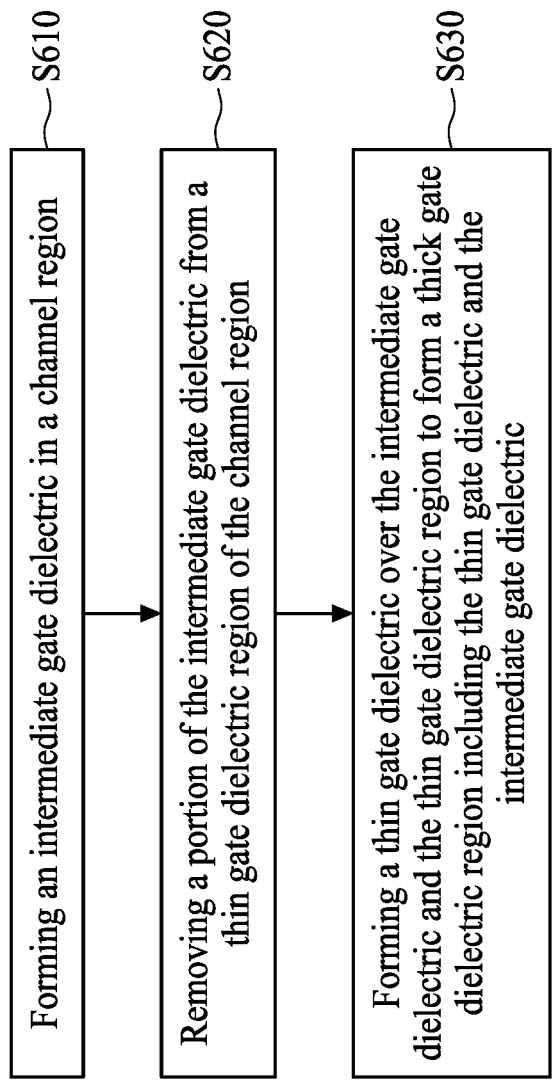
FIG. 6 is a flow diagram of a method of forming a sub-word line driver circuit in accordance with some embodiments of the present disclosure.
Figure 7A:
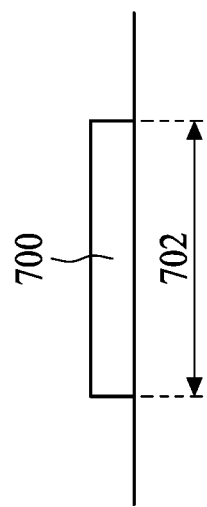
FIGS. 7A to 7C depict formation of the sub-word line driver circuit in accordance with steps of the flow diagram of FIG. 6, in accordance with some embodiments of the present disclosure.
Figure 7B:
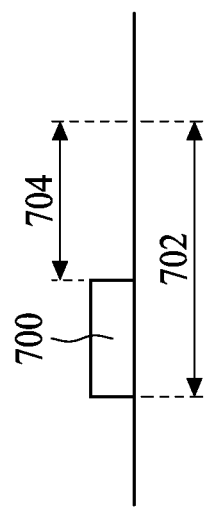
Figure 7C:
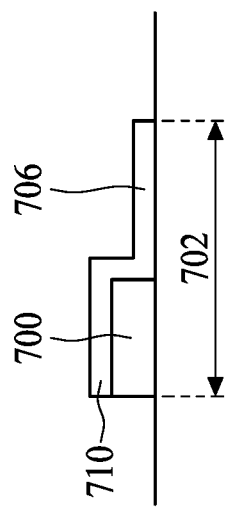

FIG. 6 is a flow diagram of a method of forming a sub-word line driver circuit in accordance with some embodiments of the present disclosure. FIGS. 7A to 7C depict formation of the sub-word line driver circuit in accordance with steps of the flow diagram of FIG. 6. With reference to FIG. 6 and FIGS. 7A to 7C, a method of forming the sub-word line driver circuit includes forming an intermediate gate dielectric 600 in a channel region 702 (Step S610). In some embodiments, the formation of the intermediate gate dielectric 700 may be determined by an oxide definition mask, for example. The intermediate gate dielectric 700 is removed from a thin gate dielectric region 704 of the channel region 702 (Step S620), which may be performed using another oxide definition mask, for example. A thin gate dielectric 706 is formed over the intermediate gate dielectric 700 and the thin gate dielectric region 704, in which a thick gate dielectric region 710 includes the thin gate dielectric 706 and the intermediate gate dielectric 700 (Step S630). Additional steps of forming the sub-word line driver may include the formation of gate regions and diffusion regions, as well as other suitable processing steps.

Figure 8:
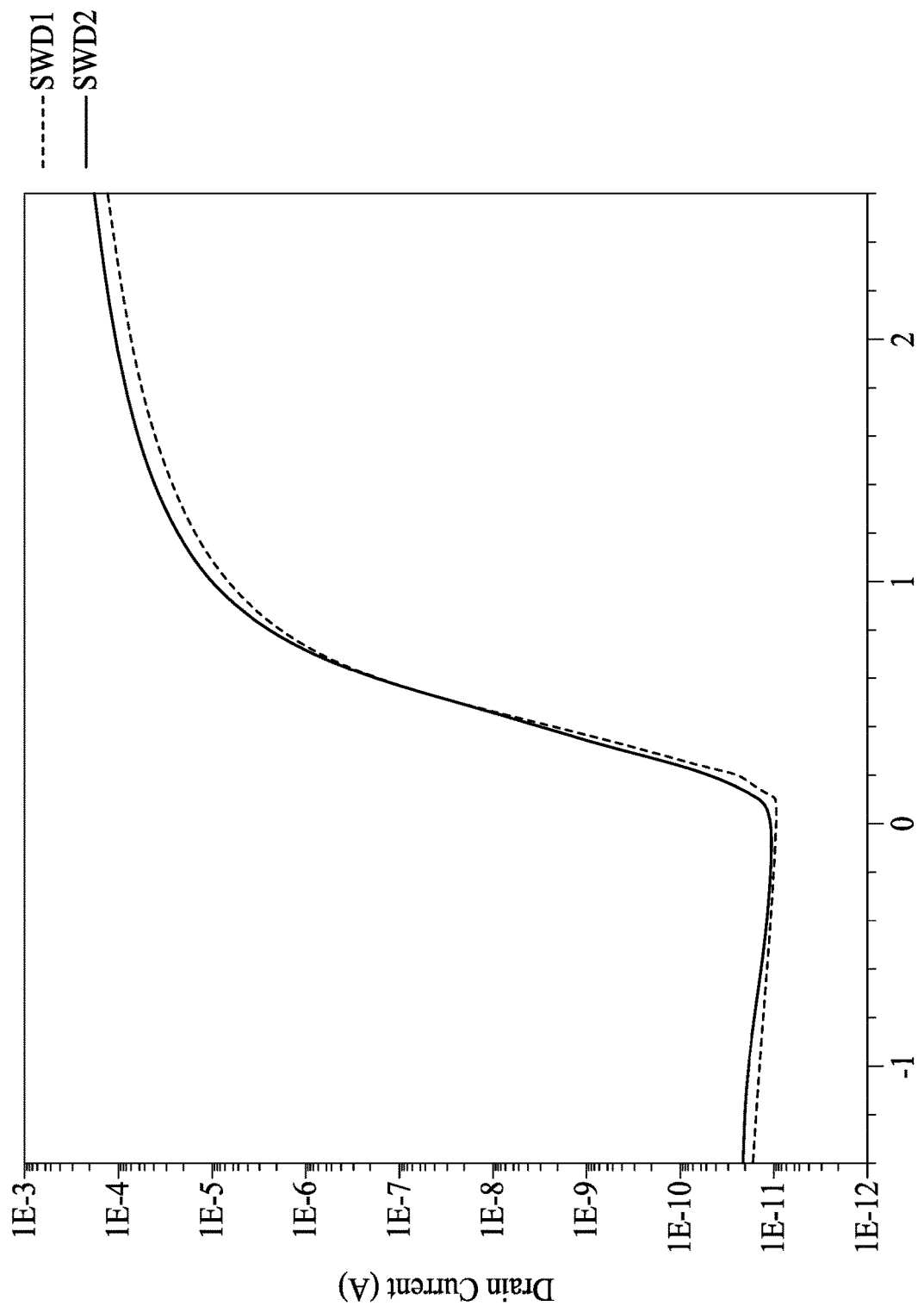
FIG. 8 is a diagram depicting a relationship between drain current and gate voltage of different sub-word line driver circuits in accordance with some embodiments of the present disclosure.

FIG. 8 is a diagram depicting a relationship between drain current and gate voltage of different sub-word line driver circuits in accordance with some embodiments of the present disclosure. In FIG. 8, a sub-word line driver circuit SWD1 does not include the variable-thickness gate dielectric 410 of the present disclosure, while a sub-word line driver circuit SWD2 includes the variable-thickness gate dielectric 410. As shown in FIG. 8, the sub-word line driver circuit SWD2 exhibits superior device characteristics when compared to the sub-word line driver circuit SWD1.

One aspect of the present disclosure provides a sub-word line driver circuit includes a substrate, a plurality of gate lines formed on the substrate, at least one gate tab formed on the substrate, and a variable-thickness gate dielectric. The substrate includes an isolation area and an active area. The gate lines are arranged in a first direction and extend in a second direction perpendicular to the first direction. The gate tab extends in the first direction to cover the isolation area, in which the gate lines and the gate tab form at least one gate region on the substrate. The variable-thickness gate dielectric is disposed between the gate region and the active area. The variable-thickness gate dielectric includes a thick gate dielectric region disposed over a first portion of the active area, and a thin gate dielectric region disposed over a second portion of the active area.

Another aspect of the present disclosure provides a semiconductor memory device, including a sub-word line driver circuit and a memory cell array. The sub-word line driver circuit is configured to provide a sub-word line with a sub-word line drive signal in response to a word line enable signal. The memory cell array includes a plurality of memory cells, and each of the memory cells connects to the sub-word line and a bit line. The sub-word line driver circuit includes a substrate, a plurality of gate lines formed on the substrate, at least one gate tab formed on the substrate, and a variable-thickness gate dielectric. The substrate includes an isolation area and an active area. The gate lines are arranged sequentially in a first direction and extend in a second direction perpendicular to the first direction. The gate tab extends in the first direction to cover the isolation area, in which the gate lines and the gate tab form at least one gate region on the substrate. The variable-thickness gate dielectric is disposed between the gate region and the active area. The variable-thickness gate dielectric includes a thick gate dielectric region disposed over a first portion of the active area, and a thin gate dielectric region disposed over a second portion of the active area.

Another aspect of the present disclosure provides a method of forming a sub-word line driver circuit, including forming an intermediate gate dielectric in a channel region; removing the intermediate gate dielectric from a thin gate dielectric region of the channel region; and forming a thin gate dielectric over the intermediate gate dielectric and the thin gate dielectric region, in which a thick gate dielectric region includes the thin gate dielectric and the intermediate gate dielectric.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods and steps.

What is claimed is:

1. A sub-word line driver circuit, comprising:
    a substrate comprising an isolation area and an active area;
    a plurality of gate lines formed on the substrate, the gate lines being arranged in a first direction and extending in a second direction perpendicular to the first direction;
    at least one gate tab formed on the substrate, the at least one gate tab extending in the first direction to cover the isolation area, wherein the gate lines and the at least one gate tab form at least one gate region on the substrate; and
    a variable-thickness gate dielectric disposed between the gate region and the active area, the variable-thickness gate dielectric comprising a thick gate dielectric region disposed over a first portion of the active area and a thin gate dielectric region disposed over a second portion of the active area, wherein a thickness of the thick gate dielectric region is larger than a thickness of the thin gate dielectric region.

2. The sub-word line driver circuit of claim 1, wherein a length of the thick gate dielectric region is determined according to the at least one gate tab.

3. The sub-word line driver circuit of claim 1, wherein a thickness of the thick gate dielectric region is determined according to the at least one gate tab.

4. The sub-word line driver circuit of claim 1, wherein the thick gate dielectric region comprises an intermediate gate dielectric region and the thin gate dielectric region.

5. The sub-word line driver circuit of claim 4, wherein the thickness of the thick gate dielectric region is substantially equal to a combined thickness of the intermediate gate dielectric region and the thin gate dielectric region.

6. The sub-word line driver circuit of claim 1, wherein the at least one gate tab is enlarged in the second direction to further cover a boundary portion of the active area, the boundary portion being adjacent to the isolation area.

7. The sub-word line driver circuit of claim 1, wherein the gate lines comprise a first gate line and a second gate line arranged sequentially in the first direction, wherein the at least one gate tab is formed to cover the isolation area between the first gate line and the second gate line.

8. The sub-word line driver circuit of claim 7, wherein the at least one gate tab is enlarged in the second direction to further cover a boundary portion of the active area between the first gate line and the second gate line, the boundary portion being adjacent to the isolation area.

9. The sub-word line driver circuit of claim 1, wherein a drain region and a source region are formed in the active area, a sub-word line drive signal is applied to the source region, a word line enable signal is applied to the gate line, and the drain region is connected to a sub-word line.

10. A semiconductor memory device, comprising:
a sub-word line driver circuit configured to provide a sub-word line with a sub-word line drive signal in response to a word line enable signal; and
a memory cell array comprising a plurality of memory cells, each of the memory cells connected to the sub-word line and a bit line,
wherein the sub-word line driver circuit comprises:
a substrate comprising an isolation area and an active area;
a plurality of gate lines formed on the substrate, the gate lines being arranged in a first direction and extending in a second direction perpendicular to the first direction;
at least one gate tab formed on the substrate, the at least one gate tab extending in the first direction to cover the isolation area, wherein the gate lines and the at least one gate tab form at least one gate region on the substrate; and
a variable-thickness gate dielectric disposed between the gate region and the active area, the variable-thickness gate dielectric comprising a thick gate dielectric region disposed over a first portion of the active area, and a thin gate dielectric region disposed over a second portion of the active area, wherein a thickness of the thick gate dielectric region is larger than a thickness of the thin gate dielectric region.

11. The semiconductor memory device of claim 10, wherein a length of the thick gate dielectric region is determined according to the at least one gate tab.

12. The semiconductor memory device of claim 10, wherein a thickness of the thick gate dielectric region is determined according to the at least one gate tab.

13. The semiconductor memory device of claim 10, wherein the thick gate dielectric region comprises an intermediate gate dielectric region and the thin gate dielectric region.

14. The semiconductor memory device of claim 13, wherein the thickness of the thick gate dielectric region is substantially equal to a combined thickness of the intermediate gate dielectric region and the thin gate dielectric region.

15. The semiconductor memory device of claim 10, wherein the at least one gate tab is enlarged in the second direction to further cover a boundary portion of the active area, the boundary portion being adjacent to the isolation area.

16. The semiconductor memory device of claim 10, wherein the gate lines comprise a first gate line and a second gate line arranged sequentially in the first direction, wherein the at least one gate tab is formed to cover the isolation area between the first gate line and the second gate line.

17. The semiconductor memory device of claim 16, wherein the at least one gate tab is enlarged in the second direction to further cover a boundary portion of the active area between the first gate line and the second gate line, the boundary portion being adjacent to the isolation area.

18. The semiconductor memory device of claim 10, wherein a drain region and a source region are formed in the active area, a sub-word line drive signal is applied to the source region, a word line enable signal is applied to the gate line, and the drain region is connected to a sub-word line.

19. A method of forming a sub-word line driver circuit, comprising:
forming an intermediate gate dielectric in a channel region;
removing the intermediate gate dielectric from a thin gate dielectric region of the channel region; and
forming a thin gate dielectric over the intermediate gate dielectric and the thin gate dielectric region, wherein a thick gate dielectric region comprises the thin gate dielectric and the intermediate gate dielectric, wherein a thickness of the thick gate dielectric region is larger than a thickness of the thin gate dielectric region.

20. The method of claim 19, wherein a length of the thick gate dielectric region is determined according to at least one gate tab, and a thickness of the thick gate dielectric region is determined according to the at least one gate tab.

* * * * *